United States Patent [19]

Carballes

[11] 4,202,000

[45] May 6, 1980

[54] DIODE CAPABLE OF ALTERNATELY FUNCTIONING AS AN EMITTER AND DETECTOR OF LIGHT OF THE SAME WAVELENGTH

[75] Inventor: Jean-Claude Carballes, Paris, France

[73] Assignee: Thomson-CSF, Paris, France

[21] Appl. No.: 918,263

[22] Filed: Jun. 22, 1978

[30] Foreign Application Priority Data

Jun. 27, 1977 [FR] France .................. 77 19616

[51] Int. Cl.² .............................................. H01L 31/12
[52] U.S. Cl. ................................ 357/19; 357/17; 357/18; 357/30; 357/13
[58] Field of Search ................ 357/17, 18, 19, 16, 357/13

[56] References Cited

U.S. PATENT DOCUMENTS

| 4,011,113 | 3/1977 | Thompson | 148/175 |
| 4,068,252 | 1/1978 | Lebailly | 357/17 |
| 4,122,407 | 10/1978 | Van Vechten | 331/94.5 H |

OTHER PUBLICATIONS

Alferov, Soviet Physics, vol. 3, No. 9, Mar. 1970 pp. 1107–1110.

Primary Examiner—Martin H. Edlow
Attorney, Agent, or Firm—Cushman, Darby & Cushman

[57] ABSTRACT

The invention relates to a diode capable of alternately operating as a detector and emitter of light in the same frequency band. This diode comprises an active zone disposed between two localizing zones and respectively forming two hetero-junctions with these zones. The reverse biassing voltage is such that the active zone is the seat of the avalanche phenomenon.

6 Claims, 6 Drawing Figures

DIODE CAPABLE OF ALTERNATELY FUNCTIONING AS AN EMITTER AND DETECTOR OF LIGHT OF THE SAME WAVELENGTH

This invention relates to a diode functioning alternately as an emitter and detector of light of the same wavelength.

It is known to make diodes which, when biassed in the forward direction, are capable of emitting light rays in a certain frequency band and which, when biassed in the reverse direction, are capable, when exposed to the same rays, of generating electrical signals in response.

Now, it is known that the two functions require opposing properties, in other words a light-emitting diode which is characterised by high efficiency when it is biassed in the forward direction becomes a light-receiving diode of low efficiency when it is biassed in the reverse direction.

The present invention relates to a light-emitting and light-detecting diode having good performance characteristics in its two functions.

The light-emitting and light-detecting diode according to the present invention comprises an active layer disposed between two localizing layers of opposite conductivity types which respectively form two hetero junctions with the active layer and which comprise contacts capable of alternately establishing predetermined forward or reverse biassing voltages at the terminals of the junctions. It is essentially characterised in that the active layer is subjected to the avalanche phenomenon for said reverse biassing voltage.

The invention will be better understood from the following description in conjunction with the accompanying drawings, wherein:

FIG. 1 is a section through the diode according to the invention.

Figure 1:
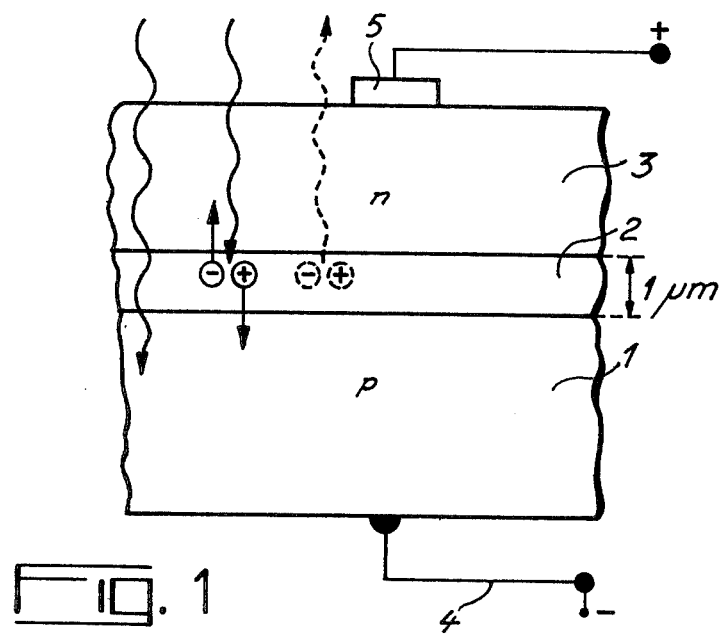
FIG. 1 shows the active zone of a photoemitting and photodetecting diode according to the invention.

This diode respectively comprises, one on top of the other, a first localizing layer 1 carrying a first contact 4 with heavy doping, for example of p type, the active layer 2 with p-type doping selected to ensure a good compromise between the optical power emitted and the rise time, the second localising layer 3 of opposite conductivity type to the first, i.e. n-type conductivity in the present case, carrying a contact 50. This layer is exposed to the light rays and is transparent in a certain wavelength band.

The structure as a whole operates as follows:

When biassed in the forward direction, the diode is conductive. The electron-hole pairs thus created are recombined in the zone 2, emitting photons that pass through the zone 3 which is transparent. Now, theory shows that for a diode such as this to function correctly, the thickness of the active layer has to be minimal specifically for reasons of luminous efficiency and rapidity.

When the diode is biassed in the reverse direction, the dark current is weak. If photons having the same wavelength as those referred to above are directed onto the zone 3, they pass through it by virtue of its transparency and recombine in the active zone where they give rise to electron-holes pairs which are the cause of an electric current. It is clear that the thickness of the active layer has to be sufficient for the ratio between the number of photons absorbed and the number of photons passing through the active layer to be as high as possible.

It follows that a good light-emitting diode functions poorly when it is biassed in the reverse direction on account of the low efficiency with which it converts light into electric current attributable to the small thickness of its active layer.

The invention enables this disadvantage to be obviated. It consists essentially in utilising the avalanche phenomenon for generating electric currents when the diode is biassed in the backward direction. It is known that the effect of the avalanche phenomenon is to multiply by a constant number the number of carriers issuing from a semiconducting zone in relation to the number of carriers injected into or generated in that zone.

This phenomenon occurs under certain conditions, namely a high electrical field in the active zone, the value of this field depending upon several other factors, such as the doping and the thickness of the active zone.

Figure 2:
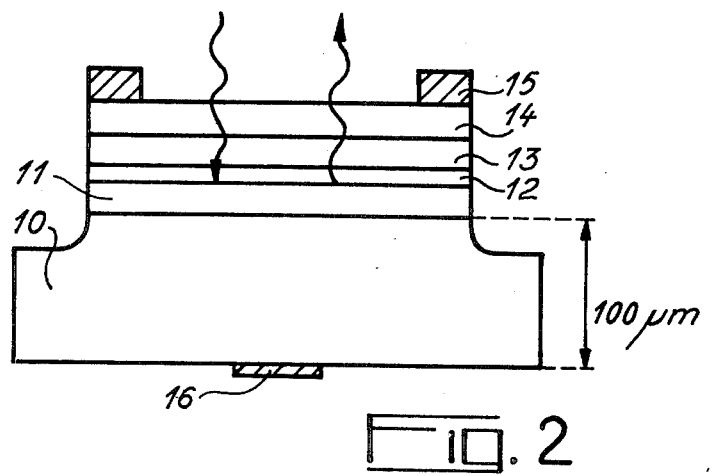
FIG. 2 is a section through a first example of embodiment of the invention.

The diode shown in FIG. 2 is one non-limiting example of embodiment of the invention.

This diode is made by well known methods of liquid-phase epitaxy.

It comprises a substrate 10 of gallium arsenide (GaAs). In the Figure, this substrate is of p-type conductivity, although all the conductivity types may be reversed. Its thickness is of the order of 100 μm. A first layer 11 having a thickness of 1 micron has been deposited onto this substrate by epitaxy, its formula being:

$$Ga_yAl_{1-y}As$$

and its doping, of p-type being of the order of $10^{17}$ to $10^{18}$ at/cc with y of the order of 0.7 (0.60 to 0.80). The doping material used is germanium. This layer is the first localising layer. Onto this layer is deposited the active layer 12 of p-type conductivity but with heavier doping ($10^{18}$ to $10^{19}$ at/cc), germanium again being used as the doping material. The composition of the active layer is:

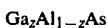

$$Ga_zAl_{1-z}As$$

with z amounting to between 0.9 and 1. Its thickness is of the order of 1 micron.

The second localizing layer 13 having a thickness of the order of 3 μm is deposited onto this active layer. It is of n+ type conductivity, being doped with tin in a concentration of from $10^{18}$ to $10^{19}$ at/cc. Its chemical formula is

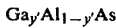

$$Ga_{y'}Al_{1-y'}As$$

with y'≃y.

Onto this layer is deposited a layer 14 of n+ type conductivity (substantially the same doping as the preceding layer) with a thickness of the order of 5 μm, its formula being:

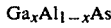

$$Ga_xAl_{1-x}As$$

with $x \simeq 0.85$.

With gold-based alloys, a chemical composition such as this enables ohmic contacts of low resistivity to be obtained.

The structure as a whole has been subjected in known manner to a "mesa" treatment which overlaps onto the substrate. Contacts 15 and 16 are deposited on the layer 14 and the substrate 10, respectively.

Figure 3:
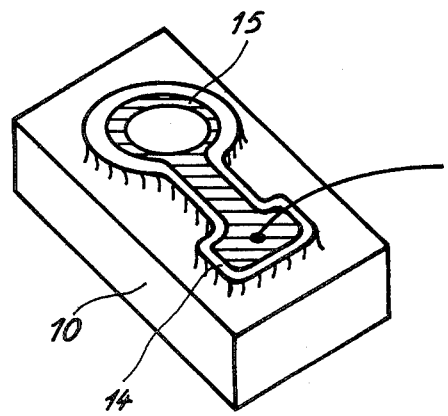
FIG. 3 is a perspective view of the diode shown in FIG. 2 with its contacting system.

The structure is shown in perspective in FIG. 3. The substrate 10 is parallelepipedic in shape, the contact 15 having the shape illustrated, i.e. it is annular in shape. Only the layer 14 and the sides of the "mesa" are visible.

The structure operates as follows:

(a) Forward biassing: the structure as described is adapted to operate at $\lambda = 830$ nm.

The bias applied is of the order of 1.5 V to 2 V. The biassing current is adjusted from a few milliamperes to several amperes.

The layer 14 is transparent to the photons as are the localising layer 13 and the layer 12. The layer 11 is opaque. As mentioned above, the dimensions of the diode are such that it operates as an emitter of light. The photons emitted in the zone 12 pass through the localising layer 13, which is transparent to them, and the layer 14 of which the composition is such that ohmic contacts can readily be implanted on it and which can easily be given a thickness of 5 μm which is small enough for it to be transparent to the photons, the photons being emitted at its upper face in the direction of the arrows. In emission, for I=50 mA, the optical power amounts to more than 1 mW and the rise and fall time from 10 to 90% of the power is less than 10 msec.

(b) Reverse biassing: a voltage of 15 to 20 volts is applied in the reverse direction. Experience has shown that the active zone is the site of an avalanche phenomenon. In other words, the photons impinging on the zone 14 pass through this zone and the localising zone 13 which are by nature transparent. By virtue of its minimal thickness, the active zone 12 absorbs a small proportion of photons, although each electron-hole pair created gives by avalanche an amplified current; the sensitivity level is greater than 0.5 A/W for V=18 V.

It is pointed out that the active zone forms two hetero junctions with the localizing layers. Since they are obtained by epitaxy, these two hetero-junctions are very effectively localizing which means that the thickness and the doping of the layer are very well defined. It is probably for this reason that, on the one hand, the avalanche effect not only occurs, but is also reproducible with very considerable precision from one sample to another.

Figure 4:
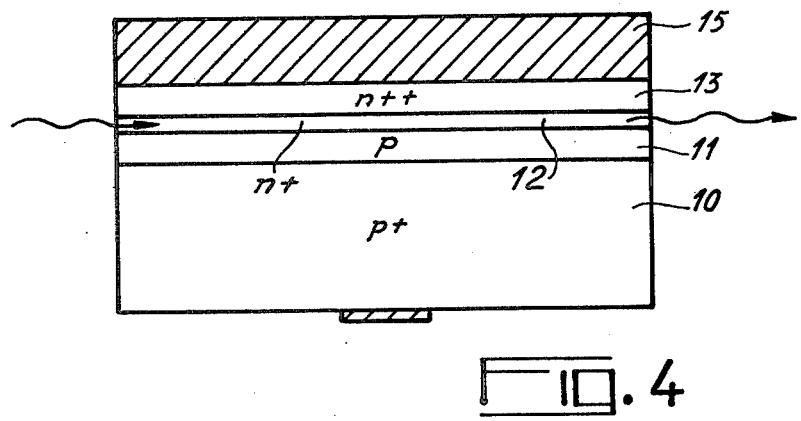
FIG. 4 is a section through a second example of embodiment of the invention.

FIG. 4 is a cross-section through a second example of embodiment of the invention. In FIG. 4, the same references denote the same elements as in the preceding Figure. FIG. 4 again shows the layer 11, the first localizing layer, the active layer 12, the localizing layer 13 and the contacting layer 14 which may be of greater thickness and made of pure gallium arsenide because it does not have to be transparent to the emission. This takes place through the two faces of the active layer perpendicular to the junctions. It is known that, by forming localizing contacts on the surface of the upper layer of structures such as these and providing that the two emitting-receiving faces are cleaved, the diode biassed in the forward direction can function as a "laser" diode. When the diode is biassed in the reverse direction, the avalanche phenomenon arises, the localizing layers and the active layer having the same parameters as the diode shown in the preceding Figure.

Figure 5:
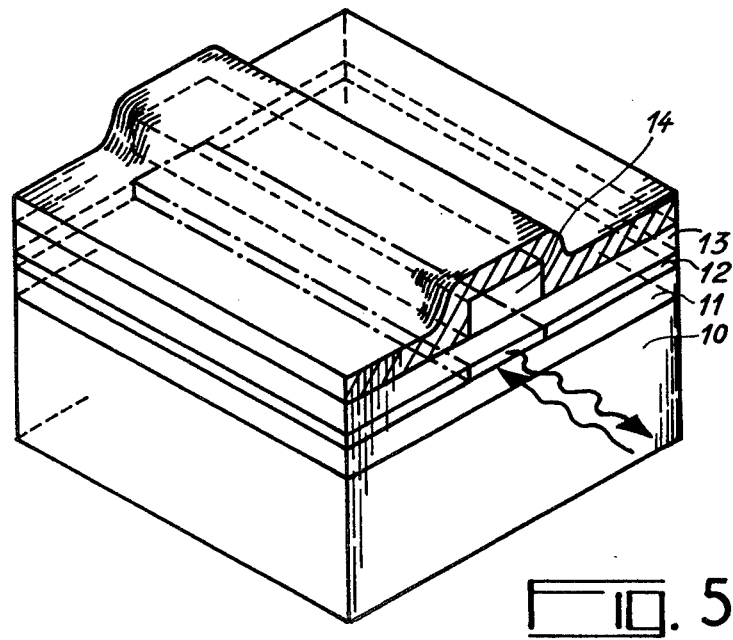
FIG. 5 is a perspective view of a "laser" and photodetecting diode derived from that shown in FIG. 4.

FIG. 5 is a perspective view of the light-detecting "laser" diode. The layer 14 is reduced to a ribbon onto which the gold layer 15 is deposited. Since the gold contact on the localizing layer is highly resistive, the current lines are localized below the ribbon during emission and delimit the Perot Fabry cavity with the cleaved faces. During reception, the avalanche phenomenon occurs under the same conditions as in FIG. 2. In the above example of wavelength, the width of the "laser" band is of the order of 6 μm. Experience has shown that a width of this order is favourable to uniform distribution of the luminous energy and has a good linearity of the current response/photons emitted curve.

Figure 6:
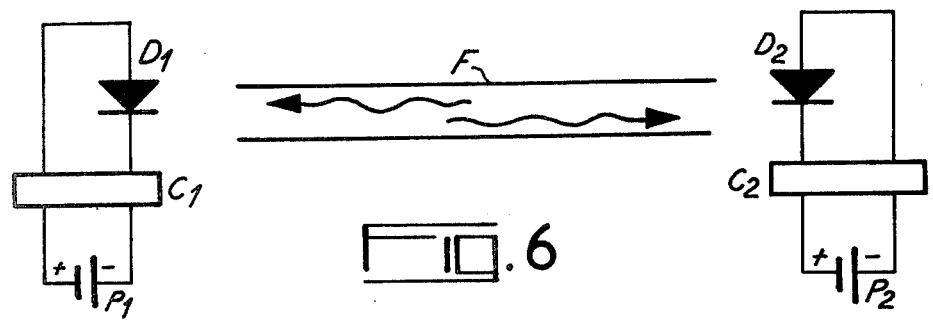
FIG. 6 shows an optical fibre telecommunications system using the diode according to the invention.

FIG. 6 diagrammatically illustrates an optical fibre connection using the diodes according to the invention.

An optical fibre F receives the emissions of two diodes $D_1$ and $D_2$. This connection operates by alternation. Two batteries $P_1$ and $P_2$ bias the two diodes in the forward direction or in the reverse direction by means of two switches $C_1$ and $C_2$.

If the diode $D_1$ is biassed in the forward direction, the diode $D_2$ is biassed in the reverse direction and the system functions in the direction $D_1 \rightarrow D_2$. In the opposite case, it functions in the direction $D_2 \rightarrow D_1$.

What I claim is:

1. A diode capable of functioning alternately as an emitter and detector of light for a predetermined wavelength, comprising: an active semiconductor material layer capable of absorbing or generating photons of said predetermined wavelength, depending upon the direction in which it is biassed, first and second localizing semiconductor material layers having opposite conductivity types and respectively forming two hetero-junctions with said active semiconductor material layer, said two localizing layers; electrical contact means for establishing electrical connection to each of said localizing layers so that said diode can be biassed in either the forward or reverse direction and; wherein said active layer having a thickness and a doping such that it is the site of an avalanche phenomenon when said diode is biassed in the reverse direction, for a predetermined voltage having a magnitude less than 30 volts.

2. A diode as claimed in claim 1, wherein said active layer and the two localising layers are compounds of gallium arsenide and aluminium.

3. A diode as claimed in claim 2, wherein said active layer and the first and second localising layers are respectively made of materials having the following respective formulae:

| | |
|---|---|
| $Ga_zAl_{1-z}As$ | with $0.9 < z < 1$ |
| $Ga_yAl_{1-y}As$ | |
| $Ga_{y'}Al_{1-y'}As$ | with $0.60 < y \simeq y' < 0.80$ | with the active layer having an n-type or p-type doping, the two localising layers having doping concentrations of from $10^{17}$ to $10^{19}$ at/cc.

4. A diode as claimed in claim 3, wherein said first localising layer is transparent to said emissions and is covered by a third layer of low aluminium content having the formula:

$$Ga_xAl_{1-x}As$$

with x of the order of 0.8 to 0.9.

5. A diode as claimed in claim 4, comprising a contact on the third layer, this contact comprising an opening to allow said emissions to pass through.

6. A diode as claimed in claim 5, wherein said active layer is disposed in such a way as to receive the light emissions directly, the light emissions being substantially perpendicular to the current lines in the diode.

* * * * *